(12) United States Patent
Kobayashi et al.

(10) Patent No.: US 7,598,660 B2
(45) Date of Patent: Oct. 6, 2009

(54) MONOLITHIC PIEZOELECTRIC ELEMENT

(75) Inventors: Shozo Kobayashi, Yasu (JP); Hiromitsu Hongo, Yasu (JP); Koichi Hayashi, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 125 days.

(21) Appl. No.: 11/837,000

(22) Filed: Aug. 10, 2007

(65) Prior Publication Data

US 2007/0269667 A1 Nov. 22, 2007

Related U.S. Application Data

(63) Continuation of application No. PCT/JP2005/023651, filed on Dec. 22, 2005.

(30) Foreign Application Priority Data

Feb. 15, 2005 (JP) ............................. 2005-038232

(51) Int. Cl.
*H01L 41/083* (2006.01)
(52) U.S. Cl. ...................................... 310/366
(58) Field of Classification Search .................. 310/366
See application file for complete search history.

(56) References Cited

U.S. PATENT DOCUMENTS

| | | | |
|---|---|---|---|
| 4,523,121 A | 6/1985 | Takahashi et al. | |
| 5,073,740 A | 12/1991 | Jomura et al. | |
| 5,196,757 A | 3/1993 | Omatsu | |
| 6,765,337 B1* | 7/2004 | Heinz et al. | 310/328 |
| 7,282,835 B2* | 10/2007 | Kawakami | 310/313 A |
| 7,288,875 B2* | 10/2007 | Kadotani et al. | 310/328 |
| 7,498,727 B2* | 3/2009 | Nakamura et al. | 310/366 |
| 2001/0033125 A1* | 10/2001 | Takao et al. | 310/366 |
| 2006/0238073 A1* | 10/2006 | Ragossnig et al. | 310/328 |
| 2008/0024043 A1* | 1/2008 | Oakley et al. | 310/366 |

FOREIGN PATENT DOCUMENTS

| | | | |
|---|---|---|---|
| EP | 1 764 844 A * | 3/2007 | |
| EP | 1 944 813 A * | 7/2008 | |
| JP | 61-124183 A | 6/1986 | |
| JP | 04-299588 A | 10/1992 | |
| JP | 06-005794 A | 1/1994 | |
| JP | 06-204581 A | 7/1994 | |
| JP | 08-274381 A * | 10/1996 | |
| JP | 11-121820 A | 4/1999 | |
| JP | 2000-133851 A | 5/2000 | |
| JP | 2001-024247 A | 1/2001 | |
| JP | 2001-102646 A | 4/2001 | |
| JP | 2005-108989 A * | 4/2005 | |
| WO | WO-2006/042791 A1 * | 4/2006 | |

OTHER PUBLICATIONS

Official Communication for PCT Application No. PCT/JP2005/023651; mailed on Feb. 28, 2006.

* cited by examiner

*Primary Examiner*—Thomas M Dougherty
(74) *Attorney, Agent, or Firm*—Keating & Bennett, LLP

(57) ABSTRACT

A monolithic piezoelectric element includes a stack, and the stack includes a crack-forming conductive layer arranged to intentionally form a small crack in the stack. The small crack alleviates stress, thereby preventing the occurrence of a large crack that may extend to the piezoelectrically active region.

11 Claims, 6 Drawing Sheets

MONOLITHIC PIEZOELECTRIC ELEMENT

BACKGROUND OF THE INVENTION

1. Field of the Invention

The present invention relates to monolithic piezoelectric elements, such as monolithic piezoelectric actuators.

2. Description of Related Art

Monolithic piezoelectric elements are known as a type of piezoelectric element that converts electric energy into mechanical energy using an electrostrictive effect of solid material. The monolithic piezoelectric element is formed by alternately stacking piezoelectric ceramic layers and internal conductive layers.

The monolithic piezoelectric element has a similar structure as monolithic ceramic capacitors, and the internal conductive layers are alternately connected to one and the other external electrode. When a voltage is applied to the two external electrodes, an electric field is generated between each of the two adjacent internal conductors, and thus distortion occurs in the ceramic layers.

However, the electric field is generated to cause distortion only in a region (piezoelectrically active region) where the internal conductive layers overlap when viewed in the stacking direction, and the distortion does not occur in the other region (piezoelectrically inactive region), where the internal conductors do not overlap and hence no electric field is generated.

Consequently, when a large distortion is produced by applying a voltage, a high stress is generated at the boundary between the piezoelectrically active region and the piezoelectrically inactive region. The stress may mechanically break the stack. For example, a large crack may occur between the internal conductive layer and the ceramic layer.

In order to prevent the stack from being broken by the internal stress, Japanese Examined Patent Application Publication No. 6-5794 has disclosed that grooves extending in a direction parallel to the internal conductive layers are formed in a side surface parallel to the stacking direction of the stack. Hence, the invention described in Japanese Examined Patent Application Publication No. 6-5794 alleviates the concentration of the stress by removing part of the piezoelectrically inactive region.

Although Japanese Examined Patent Application Publication No. 6-5794 does not disclose the process for forming the grooves in detail, they may be formed by, for example, using ceramic green sheets on which a vanishing material such as carbon paste has been printed. The vanishing material is eliminated during firing, thus forming the grooves. The grooves may be cut in the stack with a wire saw after firing.

However, these methods have disadvantages.

In the method of eliminating the vanishing material to form the grooves, the piezoelectric ceramic layers are fused and bonded together after disappearance of the vanishing material because the vanishing material disappears at a temperature lower than the firing temperature of the piezoelectric ceramic layers. Consequently, the grooves cannot be formed in a desired shape.

The method using a wire saw is inferior in processing precision, and it cannot be applied to the process using thin ceramic layers. In addition, the processing cost is high, and accordingly the manufacturing cost is increased.

SUMMARY OF THE INVENTION

In order to overcome the problems described above, preferred embodiments of the present invention provide a monolithic piezoelectric element that can be easily manufactured while the stack is prevented from being mechanically broken by stress.

A monolithic piezoelectric element according to a preferred embodiment of the present invention includes a stack including piezoelectric ceramic layers and internal conductive layers that are integrally formed, and external electrodes formed on the surface of the stack. The stack further includes a crack-forming conductive layer arranged inside the stack so as to form a crack in the stack.

By forming the crack-forming conductive layer, a tiny crack can be intentionally formed in the vicinity of the crack-forming conductive layer, and thus stress can be reduced and dissipated. Thus, the occurrence of a large crack that degrades the performance of the element can be prevented.

In the monolithic piezoelectric element according to a preferred embodiment of the present invention, the interfacial strength between the crack-forming conductive layer and the ceramic layer may be lower than the interfacial strength between the internal conductive layer and the ceramic layer.

Thus, a tiny crack can be preferentially formed at the interface between the crack-forming conductive layer and the ceramic layer having a lower interfacial strength. The tiny crack can effectively prevent a large crack that degrades the performance of the element.

The technique for reducing the interfacial strength between the crack-forming conductive layer and the ceramic layer to lower than the interfacial strength between the internal conductive layer and the ceramic layer is not particularly limited. For example, it can be realized in a structure in which the internal conductive layers contain a ceramic material having the same composition system as the ceramic contained in the ceramic layers, and in which the crack-forming conductive layer does not contain the ceramic material having the same composition system as the ceramic material of the ceramic layer or contains an amount of the ceramic material that is lower than the amount in the internal conductive layer.

By adding to a conductor a ceramic material having the same composition system as the ceramic material contained in the ceramic layer, the interfacial strength between the conductor and the ceramic layer is increased. Accordingly, the interfacial strength between the crack-forming conductive layer and the ceramic layer can be reduced to lower than the interfacial strength between the internal conductive layer and the ceramic layer by adding the ceramic material to the internal conductive layer to enhance the interfacial strength between the internal conductive layer and the ceramic layer while the crack-forming conductive layer contains the ceramic material in a lower proportion or does not contain the ceramic material.

Ceramic materials having the same composition systems each other refer to ceramic materials containing the same element as a principal constituent. Preferably, the internal conductive layer contains a ceramic material having the same composition as the ceramic material contained in the ceramic layers.

The crack-forming conductive layer may have a larger thickness than the internal conductive layer.

As the thickness of a conductor is reduced, ceramic cross-links are more easily formed in the conductor, and accordingly, the interfacial strength between the conductor and the ceramic layer is increased. Therefore, the interfacial strength between the crack-forming conductive layer and the ceramic layer can be reduced to lower than the interfacial strength between the internal conductive layer and the ceramic layer by increasing the thickness of the crack-forming conductive layer so as to be greater than the thickness of the internal conductive layer.

In the monolithic piezoelectric element according to various preferred embodiments of the present invention, the crack-forming conductive layer is preferably disposed along a surface of the layers of the stack, and may be disposed on the same surfaces as the internal conductive layers or on surfaces on which the internal conductive layers are not formed.

Preferably, the crack-forming conductive layer is arranged to avoid the region where the internal conductive layers overlap in a direction in which the layers are stacked, that is, the piezoelectrically active region. Thus, the internal stress produced at the boundary between the piezoelectrically active region and the piezoelectrically inactive region can be eliminated, and cracks can be prevented from extending to the piezoelectrically active region. Consequently, the degradation of the performance of the monolithic piezoelectric element can be prevented.

In the monolithic piezoelectric element according to various preferred embodiments of the present invention, when sections are defined by dividing the stack by the surfaces of layers on which the crack-forming conductive layer is disposed, the number of sections is M, and the distortion in the stacking direction is D (μm), the distortion per section D/M may preferably be about 7.5 μm or less.

Thus, a large crack that leads to degradation of the performance of the element can be effectively prevented from occurring.

According to preferred embodiments of the present invention, the presence of the crack-forming conductive layer intentionally forms a tiny crack to alleviate stress, and consequently prevents the occurrence of large cracks and thus, the degradation of the element performance. In addition, since it is not necessary to use a vanishing material or to form a groove with a wire saw, the element can be easily manufactured by a known stacking process.

Other features, elements, steps, characteristics and advantages of the present invention will be described below with reference to preferred embodiments thereof and the attached drawings.

DETAILED DESCRIPTION OF PREFERRED EMBODIMENTS

The best mode for carrying out the present invention will now be described with reference to the drawings.

First Preferred Embodiment

Figure 1:
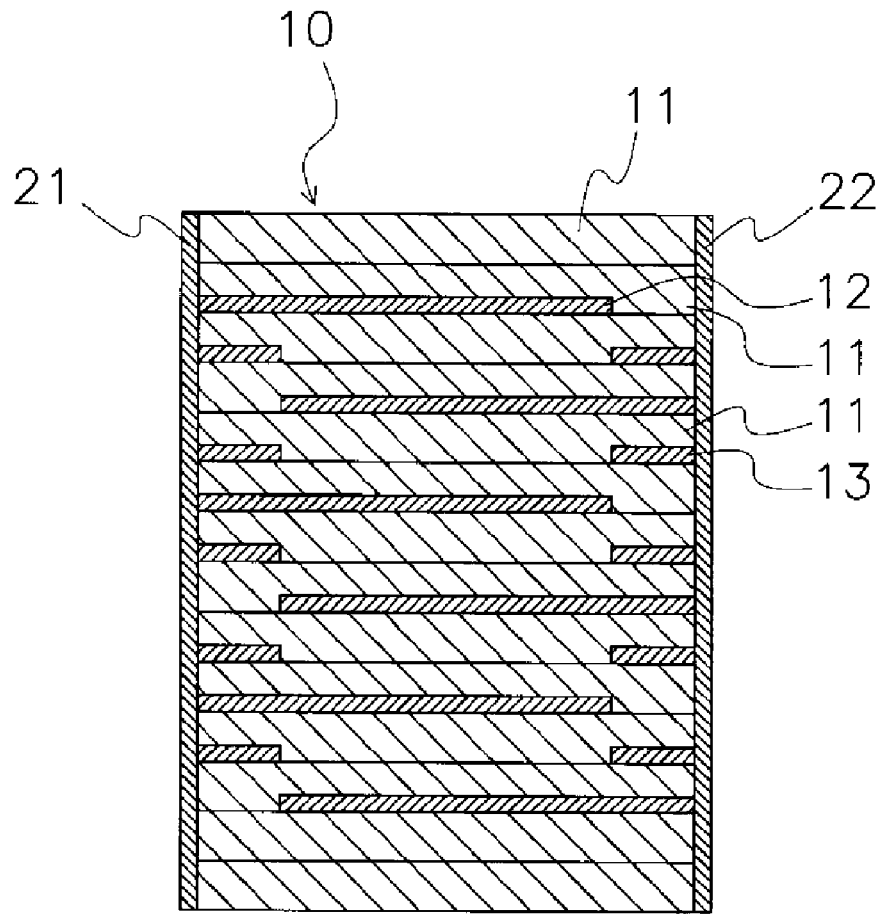
FIG. 1 is a sectional view of a monolithic piezoelectric element according to a first preferred embodiment of the present invention.

FIG. 1 is a sectional view of a monolithic piezoelectric element according to a first preferred embodiment of the invention. The monolithic piezoelectric element preferably includes a stack 10 and external electrodes 21 and 22 disposed on surfaces of the stack 10. The stack 10 includes integrally formed ceramic layers 11, internal conductive layers 12 and crack-forming conductive layers 13.

The ceramic layers 11 are preferably made of a piezoelectric ceramic material, such as lead zirconate titanate (PZT), for example.

The internal conductive layers 12 preferably mainly contain a metal, such as Ag or Pd, and are alternately connected to one and the other external electrodes 21 and 22, respectively.

The crack-forming conductive layers 13 preferably mainly contain a metal, such as Ag or Pd, and are disposed in regions (piezoelectrically inactive regions) where the internal conductive layers 12 do not overlap in the stacking direction. The crack-forming conductive layers 13 are disposed on the surfaces of the ceramic layers not having the internal conductive layers 12. Although FIG. 1 shows the internal conductive layers 12 have substantially the same thickness as the crack-forming conductive layers 13, the crack-forming conductive layers 13 have a larger thickness than the internal conductive layers 12.

The external electrodes 21 and 22 preferably mainly contain a metal, such as Ag, and formed on surfaces of the stack 10.

Figure 2:
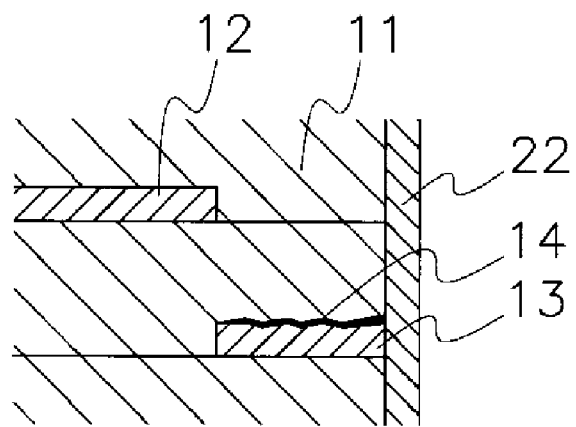
FIG. 2 is a fragmentary sectional view of the monolithic piezoelectric element according to the first preferred embodiment of the present invention.

FIG. 2 is a fragmentary enlarged sectional view schematically showing the crack-forming conductive layer 13 and its vicinity. A tiny crack 14 is formed at the interface between the crack-forming conductive layer 13 and the ceramic layer 11 after polarization. This crack 14 does not extend to the piezoelectrically active region defined by overlapping the internal conductive layers 12. There is no crack at the interface between the internal conductive layer 12 and the ceramic layer 11. This is because the presence of the crack-forming conductive layer 13 intentionally forms a tiny crack 14 at the interface between the crack-forming conductive layer 13 and the ceramic layer 11, thereby reducing the stress.

A method for manufacturing the monolithic piezoelectric element will now be described with reference to FIG. 3.

First, predetermined weights of metal oxides, such as titanium oxide, zirconium oxide, and lead oxide, are weighed out, and the mixture is calcined to yield a piezoelectric PZT ceramic material. The piezoelectric ceramic material is pulverized into piezoelectric ceramic powder, and the ceramic powder is agitated and mixed with water or an organic solvent, an organic binder, a dispersant, an antifoaming agent, and so on in a ball mill to yield a ceramic slurry.

The ceramic slurry is vacuum-defoamed, and is then formed into approximately 80 μm thick plain ceramic green sheets by the doctor blade method.

Internal conductive layer patterns 41 are printed on some of the plain ceramic green sheets with an electroconductive paste containing Ag and Pd in a weight ratio of about 7:3 to prepare internal conductive layer ceramic green sheets 31. In this instance, the printing conditions are controlled so that the paste of the internal conductive layer pattern 41 is applied at a thickness of about 1.0 μm, for example.

Also, crack-forming conductive layer patterns 42 are printed on other plain ceramic green sheets with an electroconductive paste containing Ag and Pd in a weight ratio of about 7:3 to prepare crack-forming conductive layer ceramic green sheets 32. In this instance, the printing conditions are controlled so that the paste of the crack-forming conductive layer pattern 42 is applied at a thickness of about 2.0 μm, for example. The thicknesses of the internal conductive layer pattern 41 and the crack-forming conductive layer pattern 42 refer to the metal thicknesses measured by fluorescent X-ray spectrometry.

The internal conductive layer patterns 41 and the crack-forming conductive layer patterns 42 are each in contact with at least one edge of the corresponding ceramic green sheet so that they can be connected to the subsequently formed external electrodes.

Figure 3:
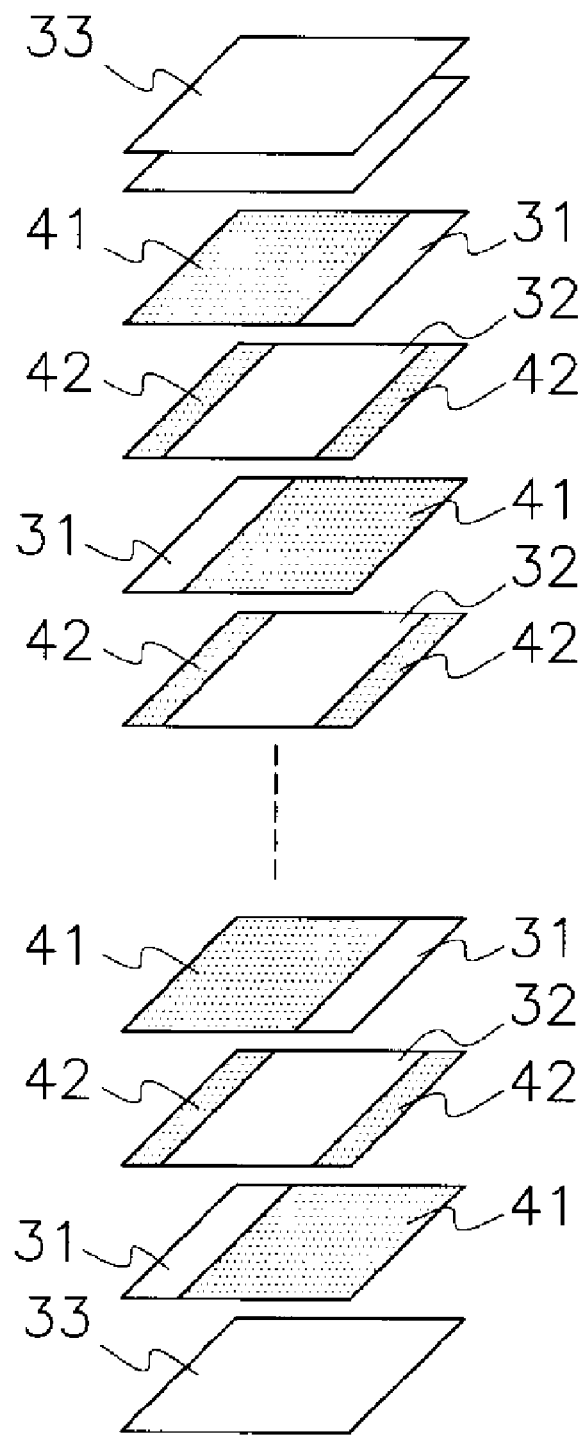
FIG. 3 is a perspective view of a process for manufacturing the monolithic piezoelectric element according to the first preferred embodiment of the present invention.

The internal conductive layer ceramic green sheets 31, the crack-forming conductive layer ceramic green sheets 32, and plain ceramic green sheets 33 are stacked as shown in FIG. 3 to prepare a green stack. The internal conductive layer ceramic green sheets 31 are alternately stacked so that the internal conductive layer patterns 41 are led out alternately to the side ends in the lateral direction. Also, the internal conductive layer ceramic green sheets 31 and the crack-forming conductive layer green sheets 32 are alternately stacked. The plain ceramic green sheets 33 are disposed at both ends of the stack in the stacking direction.

The resulting green stack is heated to approximately 400° C. to debinder, and is then fired at approximately 1100° C. for about 5 hours in a normal atmosphere to yield the stack 10. The resulting stack 10 preferably measures approximately 7 mm by 7 mm and 30 mm in height, for example.

Then, an electroconductive paste containing Ag is patterned to form the external electrodes 21 and 22 shown in FIG. 1. Subsequently, Ag nets are bonded to the external electrodes 21 and 22 with an electroconductive adhesive to reinforce the external electrodes 21 and 22, and lead wires are bonded to the external electrodes 21 and 22 with solder, but the nets and wires are not shown in the figure. The side surfaces of the stack 10 are coated with an insulating resin to insulate the internal conductive layers 12 exposed at the side surfaces of the stack 10.

The external electrodes 21 and 22 are connected to a direct current source and polarized at an electric field intensity of about 3 kV/mm in a thermostatic chamber of about 80° C., for example. Thus, the monolithic piezoelectric element shown in FIG. 1 is completed.

Samples were prepared in the following procedure for measuring the interfacial strengths between the internal conductive layer and the ceramic layer and between the crack-forming conductive layer and the ceramic layer.

The same ceramic green sheets as used in the above-described monolithic piezoelectric element were prepared, and internal conductive layer patterns were printed at the same thickness in the same manner as above. Five ceramic green sheets with the internal conductive layer pattern were stacked, and 20 plain ceramic green sheets were pressure-bonded to the bottom and top of the stack. The entire stack was fired under the same condition as above. Then, the resulting sintered compact was cut into samples of approximately 3 mm by 3 mm and 2.5 mm in height for measuring the interfacial strength between the internal conductive layer and the ceramic layer.

Samples for measuring the interfacial strength between the crack-forming conductive layer and the ceramic layer were also prepared in the same manner.

Each of the resulting samples was measured for the peel force between the internal conductive layer and the ceramic layer or between the crack-forming conductive layer and the ceramic layer when they were separated from each other using a tensile test apparatus, with a jig provided to the top and bottom surface of the sample. Table 1 shows the results, Weibull values m obtained by Weibull-plotting the measured values and average strength μ.

TABLE 1

|  | Weibull coefficient m | Average strength μ (MPa) |
|---|---|---|
| Internal conductive layer/ceramic layer | 5.1 | 72.4 |
| Crack-forming conductive layer/ceramic layer | 4.3 | 37.6 |

It is found that the interfacial strength between the crack-forming conductive layer and the ceramic layer is reduced to less than the interfacial strength between the internal conductive layer and the ceramic layer by setting the thickness of the crack-forming conductive layer 13 at twice the thickness of the internal conductive layer 12.

In addition, samples of a comparative example were prepared in the same manner except that the crack-forming conductive layers are not provided (Comparative Example 1). The states of three monolithic piezoelectric elements of the present preferred embodiment and three monolithic piezoelectric elements of Comparative Example 1 were observed through a microscope after polarization.

In the monolithic piezoelectric element of the present preferred embodiment, 12.6 cracks were produced on average per element. Each crack occurred in the vicinity of the crack-forming conductive layer and was very small. There was not a crack extending to the piezoelectrically active region.

On the other hand, 4.3 cracks were produced on average per element in the monolithic piezoelectric elements of the comparative example, but about one half of the cracks extended to the piezoelectrically active region.

Five monolithic piezoelectric elements each of the present preferred embodiment and the comparative example were subjected to a continuous driving test at a temperature of about 30° C. and a humidity of about 60% by applying rectangular waves of about 200 V in maximum voltage and about 30 Hz in frequency.

All the five monolithic piezoelectric elements of the present preferred embodiment were normally operated after being driven 10$^9$ times. The distortions before and after the driving test were compared, and the degradation in distortion was within 5% in all the samples. On the other hand, all the monolithic piezoelectric elements of the comparative example were mechanically damaged, and were not operational after being driven 10$^5$ times.

Samples including the crack-forming conductive layers at intervals varied by thinning out some of the crack-forming conductive layers were prepared. More specifically, each monolithic piezoelectric element was prepared such that crack-forming conductive layers are not provided at the interfaces between specific internal conductive layers and thus, the interval between the crack-forming conductive layers was varied, while in the structure shown in FIGS. 1 and 3, the ceramic layers 11 having the internal conductive layers 12 (internal conductor ceramic green sheets 31) and the ceramic layers 11 having the crack-forming conductive layers 13

(crack-forming conductive layer ceramic green sheets 32) are alternately disposed. In this instance, plain ceramic layers were disposed in regions from which the ceramic layers having the crack-forming conductive layers were thinned out so that the intervals between the internal conductive layers in the stacking direction were the same. In this example, the ceramic layers 11 having the crack-forming conductive layers 13 were arranged substantially equally in the stacking direction of the stack.

Thus, seven types of samples were prepared. Five samples each of the seven types and Comparative Example 1 of the monolithic piezoelectric element were subjected to the continuous driving test in the same manner as above.

The distortion per section, D/M, was calculated. The sections were defined by dividing the stack by the surfaces of stacked layers on which the crack-forming conductive layers were disposed, and the number of sections was designated by M.

When the number of surfaces on which the crack-forming conductive layers are disposed is N, M is expressed by equation (1). More specifically, when, for example, the crack-forming conductive layers are formed on two surfaces of the stacked layers, M=3 holes. If there is no crack-forming conductive layer on the surfaces of stacked layers, M=1 holes.

$$M = N + 1 \quad (1)$$

Figure 4:
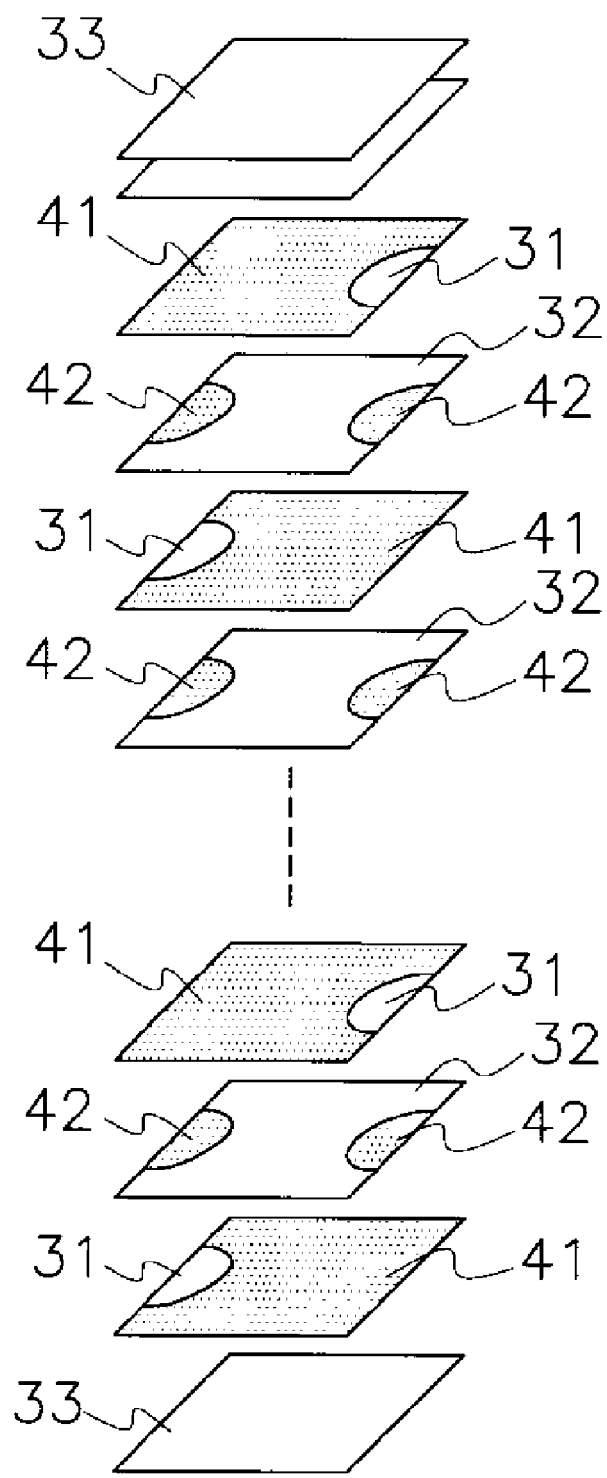
FIG. 4 is a perspective view of a modification of the monolithic piezoelectric element according to a preferred embodiment of the present invention.

The results of measurement for distortion per section, D/M, and continuous driving test are shown in Table 2. Table 2 also shows the dimension of the section in the stacking direction, L/M (L represents a dimension of the stack in the stacking direction) for reference. In Sample 7, the crack-forming conductive layers are disposed in all the regions between two adjacent internal conductive layers.

the shape of the crack-forming conductive layer patterns is not limited. For example, the shape may be semicircular, as shown in FIG. 4.

Second Preferred Embodiment

Figure 5:
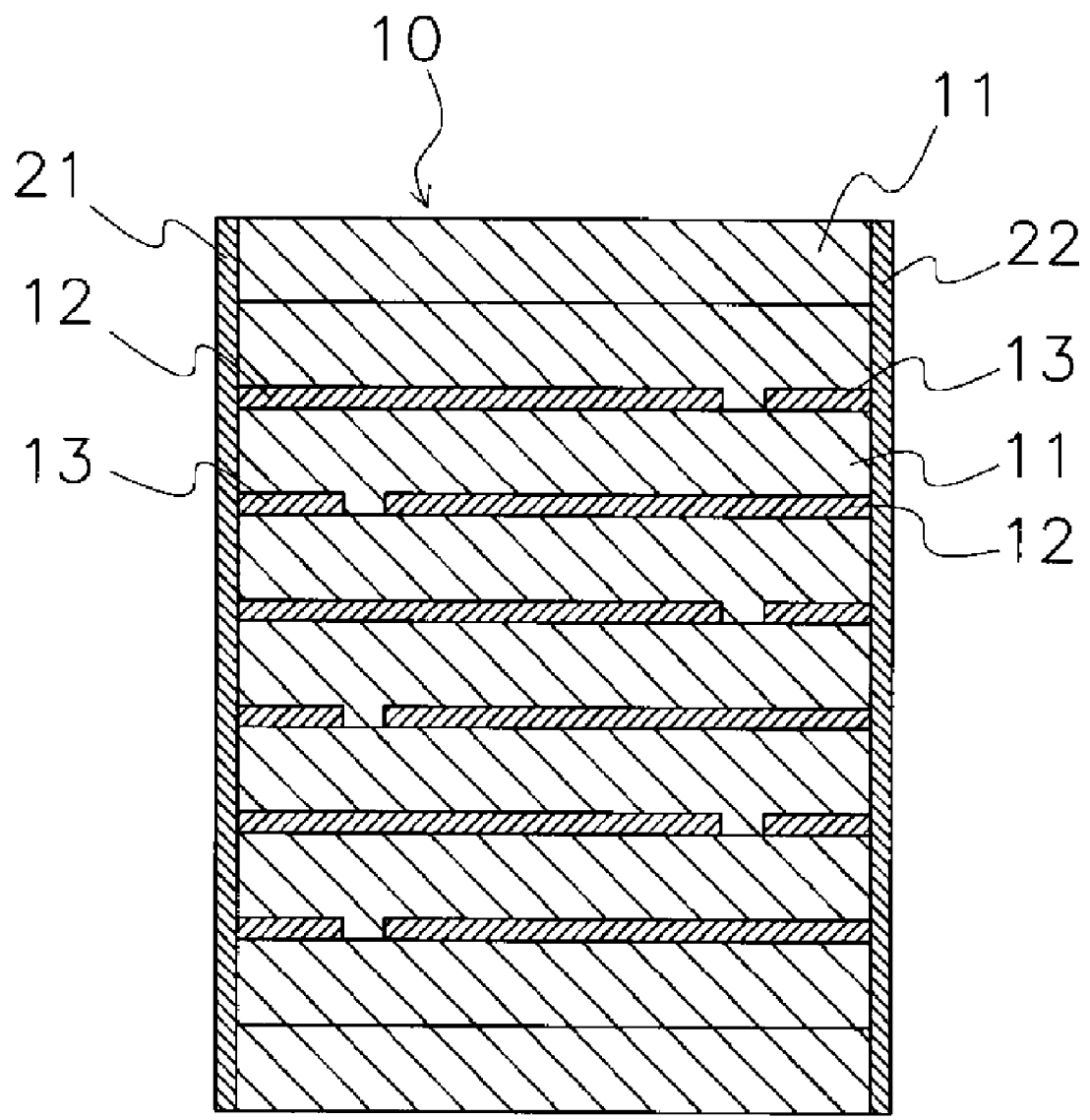
FIG. 5 is a sectional view of a monolithic piezoelectric element according to a second preferred embodiment of the present invention.

A monolithic piezoelectric element according to a second preferred embodiment of the present invention will now be described. Descriptions of elements that are the same as or corresponding to those of the first preferred embodiment will be omitted as needed. FIG. 5 is a sectional view of a monolithic piezoelectric element according to a second preferred embodiment.

The monolithic piezoelectric element includes a stack 10 and external electrodes 21 and 22. The stack 10 includes integrally formed ceramic layers 11, internal conductive layers 12 and crack-forming conductive layers 13. Although this structure is different from that of the first preferred embodiment in that the crack-forming conductive layer 13 and the internal conductive layer 12 are disposed on the same surfaces of the stacked layers, and the other parts are the same as in the first preferred embodiment.

Figure 6:
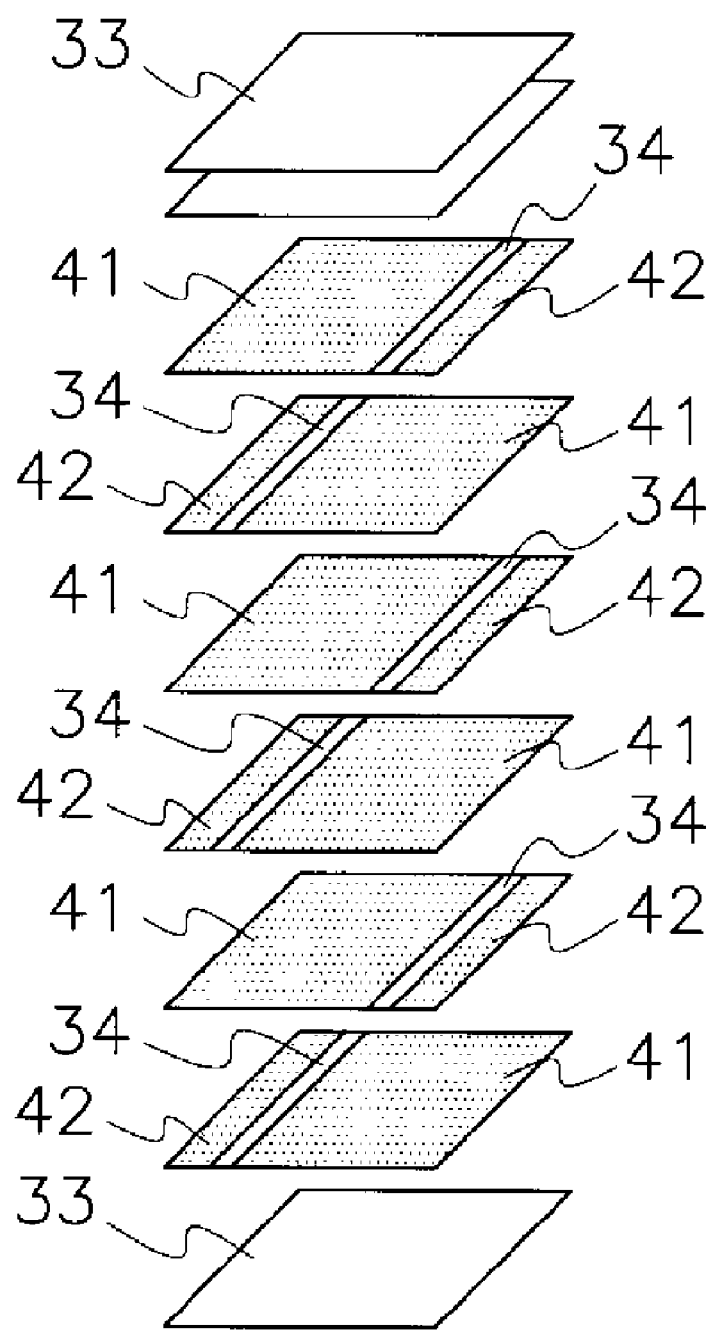
FIG. 6 is a perspective view of a process for manufacturing the monolithic piezoelectric element according to the second preferred embodiment of the present invention.

The process for manufacturing the monolithic piezoelectric element will be described below with reference to FIG. 6. First, predetermined weights of metal oxides, such as titanium oxide, zirconium oxide, and lead oxide, are weighed out, and the mixture is calcined to yield a piezoelectric PZT ceramic material. The piezoelectric PZT ceramic material is pulverized into piezoelectric ceramic powder, and the ceramic powder is agitated and mixed with water or an organic solvent, an organic binder, a dispersant, an antifoaming agent, and so on in a ball mill to yield a ceramic slurry.

TABLE 2

| Sample No. | Number of crack-forming conductive layers | Dimension per section L/M (mm) | Distortion per section D/M (μm) | Number of samples that were able to be driven at the point of driving times | | | | | |
|---|---|---|---|---|---|---|---|---|---|
| | | | | $10^4$ | $10^5$ | $10^6$ | $10^7$ | $10^8$ | $10^9$ |
| 1 | 2 | 10 | 15 | 5 | 5 | 5 | 3 | 1 | 0 |
| 2 | 5 | 5.0 | 7.5 | 5 | 5 | 5 | 5 | 5 | 4 |
| 3 | 7 | 3.75 | 5.6 | 5 | 5 | 5 | 5 | 5 | 5 |
| 4 | 9 | 3.0 | 4.5 | 5 | 5 | 5 | 5 | 5 | 5 |
| 5 | 11 | 2.5 | 3.8 | 5 | 5 | 5 | 5 | 5 | 5 |
| 6 | 14 | 2.0 | 3.0 | 5 | 5 | 5 | 5 | 5 | 5 |
| 7 | 273 | 0.1 | 0.16 | 5 | 5 | 5 | 5 | 5 | 5 |
| Comparative Example 1 | 0 | 30 | 45 | 4 | 0 | 0 | 0 | 0 | 0 |

As shown in Table 1, one of the monolithic piezoelectric elements of the comparative example did not work at e point of 104 times, and all of them did not work at the point of 105 times.

On the other hand, the monolithic piezoelectric elements of Sample Nos. 1 to 7 according to preferred embodiments the present invention exhibited enhanced durability against continuous driving in contrast to Comparative Example 1. In Sample Nos. 3 to 7, particularly, all the elements were able to be driven even at the point of 109 times. This suggests that it is preferable that the crack-forming conductive layers are disposed so as to set the distortion between the crack-forming conductive layers to less than about 7.5 μm.

While the present preferred embodiment includes substantially rectangular crack-forming conductive layer patterns, The ceramic slurry is vacuum-defoamed, and is then formed into plain ceramic green sheets with a thickness of about 160 μm by the doctor blade method.

Now, an electroconductive paste for internal conductive layers is prepared by mixing Ag powder, Pd powder, the same piezoelectric ceramic powder as used in the formation of the ceramic green sheets, and an organic vehicle. Also an electroconductive paste for the crack-forming conductive layer is prepared by mixing Ag powder, Pd powder, and an organic vehicle. The ratio of the Ag content to the Pd content is Ag:Pd=7:3 in both pastes.

Internal conductive layer patterns 41 are screen-printed on some of the plain ceramic green sheets with the electroconductive paste for internal conductive layers. Crack-forming conductive layer patterns 42 are further screen-printed with the electroconductive paste for the crack-forming conductive layers. Thus, conductor ceramic green sheets 34 are prepared. The internal conductive layer pattern 41 and the crack-forming conductive layer pattern 42 are led out to one and the other of the opposing side ends of the conductor ceramic green sheet 34, respectively.

The printing conditions are controlled so that the internal conductive layer pattern has a thickness of about 1.4 μm and the crack-forming conductive layer pattern 42 has a thickness of about 2.0 μm, for example. The thicknesses of the patterns refer to the metal thicknesses measured by fluorescent X-ray spectrometry.

The conductor ceramic green sheets 34 and plain ceramic green sheets 33 are stacked as shown in FIG. 5 to prepare a green stack. The green stack is heated to approximately 400° C. to debinder, and is then fired at approximately 1100° C. for about 5 hours in a normal atmosphere to yield the stack 10 shown in FIG. 4. The resulting stack 10 measures approximately 7 mm×7 mm and 30 mm in height, for example.

Then, an electroconductive paste containing Ag is patterned on surfaces of the stack 10 to form the external electrodes 21 and 22. Subsequently, Ag nets are bonded to the external electrodes 21 and 22 with an electroconductive adhesive to reinforce the external electrodes 21 and 22, and lead wires are bonded to the external electrodes 21 and 22 with solder, but the nets and wires are not shown in the figure. The side surfaces of the stack 10 are coated with an insulating resin to insulate the internal conductive layers exposed at the side surfaces of the stack 10.

The external electrodes 21 and 22 are connected to a direct current source and polarized at an electric field intensity of about 3 kV/mm in a thermostatic chamber of about 80° C., for example. Thus, the monolithic piezoelectric element shown in FIG. 5 is completed.

Samples were prepared in the following procedure for measuring the interfacial strengths between the internal conductive layer and the ceramic layer and between the crack-forming conductive layer and the ceramic layer.

The same ceramic green sheets as used in the monolithic piezoelectric element were prepared, and internal conductive layer patterns were printed using the same internal conductive layer conductive paste as above. Five ceramic green sheets with the internal conductive layer pattern were stacked, and 10 plain ceramic green sheets were press-bonded to the bottom and top of the stack. The entire stack was fired under the same conditions as above. Then, the resulting sintered compact was cut into samples of approximately 3 mm by 3 mm and 2.5 mm in height for measuring the interfacial strength between the internal conductive layer and the ceramic layer.

Test pieces for measuring the interfacial strength between the crack-forming conductive layer and the ceramic layer were also prepared in the same manner using the same crack-forming conductive layer electroconductive paste as above.

Each of the resulting test pieces was measured for the peel force between the internal conductive layer and the ceramic layer or between the crack-forming conductive layer and the ceramic layer when they were separated from each other using a tensile test apparatus, with a jig provided to the top and bottom surface of the test piece. Table 3 shows the results, Weibull value m obtained by Weibull-plotting the measured values and average strength μ.

TABLE 3

| | Weibull coefficient m | Average strength μ (MPa) |
|---|---|---|
| Internal conductive layer/ceramic layer | 4.8 | 74.2 |
| Crack-forming conductive layer/ceramic layer | 4.3 | 37.6 |

It is found that the interfacial strength between the internal conductive layer and the ceramic layer is increased by adding to the internal conductive layer a ceramic material having the same composition as the ceramic material contained in the ceramic layer, in comparison with the interfacial strength between the crack-forming conductive layer, which does not contain the ceramic material, and the ceramic layer.

In addition, monolithic piezoelectric elements of a comparative example were prepared in which only the internal conductive layer patterns were formed on the conductor ceramic green sheets, but the crack-forming conductive layer patterns are not formed (Comparative Example 2).

The monolithic piezoelectric elements of the present preferred embodiment and the monolithic piezoelectric elements of the comparative example were observed through a microscope after polarization. Four cracks extending to the piezoelectrically active region were observed in the monolithic piezoelectric elements of Comparative Example 2. As for the monolithic piezoelectric elements of the present preferred embodiment, 14 cracks, more than in comparative example 2, were observed, but each crack was formed in the piezoelectrically inactive region around the crack-forming conductive layer. There was not a crack extending to the piezoelectrically active region.

TABLE 4

| | Number of samples that were able to be driven at the point of driving times | | | | | |
|---|---|---|---|---|---|---|
| | $10^4$ | $10^5$ | $10^6$ | $10^7$ | $10^8$ | $10^9$ |
| Example 2 | 5 | 5 | 5 | 5 | 5 | 5 |
| Comparative Example 2 | 4 | 0 | 0 | 0 | 0 | 0 |

As shown in FIG. 4, one of the monolithic piezoelectric elements of Comparative Example 2 did not work properly at the point of $10^4$ times due to mechanical damage, and all the samples did not work properly after being driven $10^5$ times. On the other hand, all the samples of the monolithic piezoelectric element of the present preferred embodiment worked properly even after being driven $10^9$ times.

Figure 7:
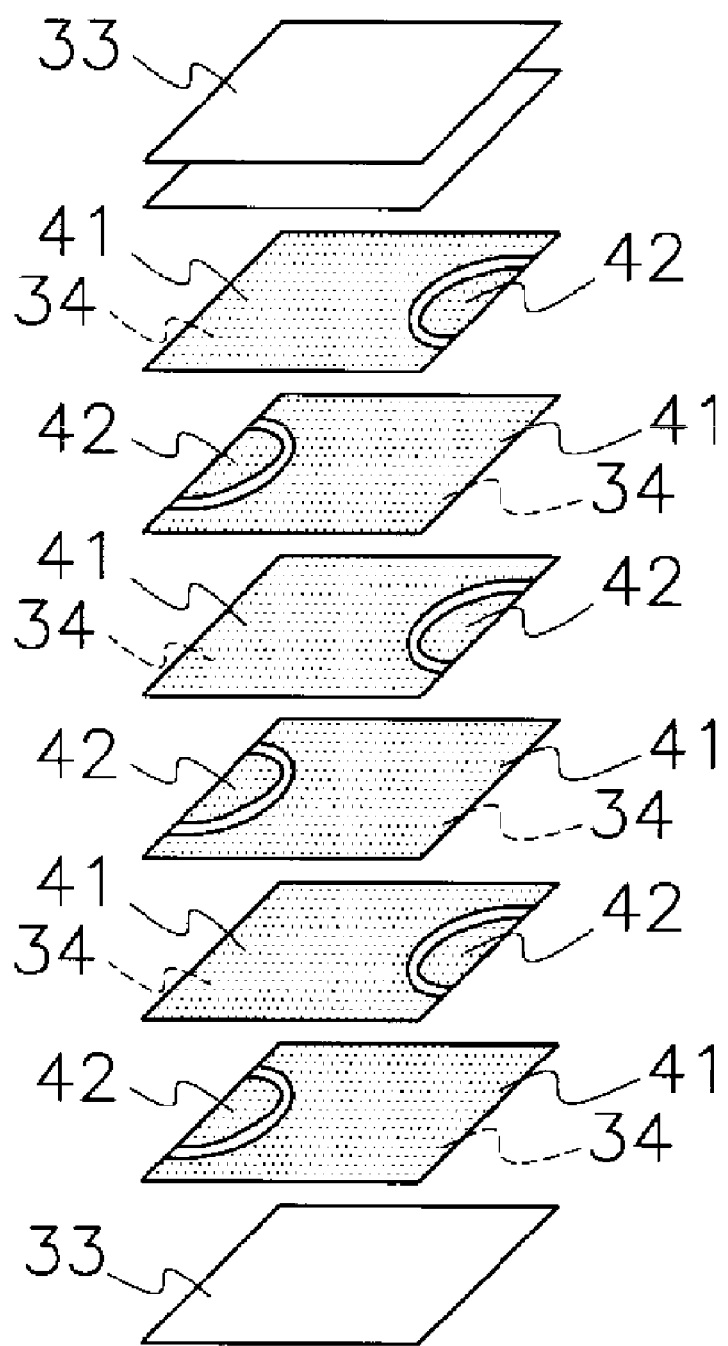
FIG. 7 is a perspective view of a modification of the monolithic piezoelectric element according to a preferred embodiment of the present invention.

While the present preferred embodiment has substantially rectangular crack-forming conductive layer patterns, the shape of the crack-forming conductive layer patterns is not limited. For example, it may be semicircular, as shown in FIG. 7.

The above-disclosed first and second preferred embodiments are simply examples of the present invention, and the invention is not limited to the disclosed preferred embodiments. For example, the crack-forming conductive layer may be formed in any shape anywhere as long as it can form a tiny crack in the piezoelectrically inactive region without extending to the piezoelectrically active region. The technique for reducing the interfacial strength between the crack-forming conductive layer and the ceramic layer to less than the interfacial strength between the internal conductive layer and the ceramic layer is not limited to the above method, and any technique may be applied. In addition, other modifications may be made without departing from the spirit and scope of the invention.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A monolithic piezoelectric element comprising:
a stack including piezoelectric ceramic layers and internal conductive layers that are integral with each other, and external electrodes disposed on a surface of the stack; and
a crack-forming conductive layer disposed inside the stack and arranged to form a crack in the stack.

2. The monolithic piezoelectric element according to claim 1, wherein the crack formed by the crack-forming layer is located only within a piezoelectrically inactive area of the stack.

3. The monolithic piezoelectric element according to claim 1, wherein the crack formed by the crack-forming layer is not located in a piezoelectrically active area of the stack.

4. The monolithic piezoelectric element according to claim 1, wherein an interfacial strength between the crack-forming conductive layer and an adjacent one of the ceramic layers is lower than an interfacial strength between one of the internal conductive layers and an adjacent one of the ceramic layers.

5. The monolithic piezoelectric element according to claim 2, wherein the internal conductive layers contain a ceramic material having the same composition system as the ceramic material contained in the ceramic layers, and the crack-forming conductive layer does not contain the ceramic material having the same composition as the ceramic material of the ceramic layers.

6. The monolithic piezoelectric element according to claim 2, wherein the internal conductive layers contain a ceramic material having the same composition system as the ceramic material contained in the ceramic layers, and the crack-forming conductive layer contains the ceramic material in a lower content than the internal conductive layers.

7. The monolithic piezoelectric element according to claim 2, wherein the crack-forming conductive layer has a larger thickness than the internal conductive layer.

8. The monolithic piezoelectric element according to claim 1, wherein the crack-forming conductive layer is disposed along a surface of the layers of the stack, and lies on the same surfaces as the internal conductive layers.

9. The monolithic piezoelectric element according to claim 1, wherein the crack-forming conductive layer is disposed along a surface of the layers of the stack, and lies on surfaces on which the internal conductive layers are not formed.

10. The monolithic piezoelectric element according to claim 1, wherein the crack-forming conductive layer is disposed in a region where the internal conductive layers do not overlap in a direction in which layers are stacked.

11. The monolithic piezoelectric element according to claim 1, wherein when sections are defined by dividing the stack by the surfaces of layers on which the crack-forming conductive layer is disposed, the number of sections is M, and the distortion in a direction in which layers are stacked is D ($\mu$m), the distortion per section D/M is about 7.5 $\mu$m or less.

* * * * *